United States Patent [19]
Kobayashi

[11] Patent Number: 5,767,959
[45] Date of Patent: Jun. 16, 1998

[54] LENS DISTORTION MEASUREMENT USING MOIRE FRINGES

[75] Inventor: Naoyuki Kobayashi, Tokyo, Japan

[73] Assignee: Nikon Corporation, Japan

[21] Appl. No.: 825,448

[22] Filed: Mar. 28, 1997

[51] Int. Cl.[6] ................................................ G01B 9/00
[52] U.S. Cl. ........................... 356/124; 356/345; 356/352
[58] Field of Search .................................. 356/124, 126, 356/352, 354, 345

[56] References Cited

U.S. PATENT DOCUMENTS 3,923,400  12/1975  Hardy ................................... 356/353
4,794,550  12/1988  Greivenkamp, Jr. .................. 356/357

Primary Examiner—Frank G. Font
Assistant Examiner—Reginald A. Ratliff
Attorney, Agent, or Firm—Skjerven, Morrill, MacPherson, Franklin & Friel; Norman R. Klivans

[57] ABSTRACT

A lens distortion measurement system has a first grating of a first pitch on a transparent support such as a quartz reticle. The reticle is disposed between an illumination source and the lens system whose distortion is to be measured. An image sensor is provided within the image projection field of the lens system. A second grating of a second (different) pitch is provided on another transparent support, disposed between the lens system and the image sensor. Optionally, a relay lens is disposed between the second support and the image sensor. Illumination propagates from the illumination source through the first support, through the lens system, through the second support and is incident on the image sensor. The illumination forms a Moire fringe having a pitch orders of magnitude greater than the pitches of the first and second gratings. Distortion in the lens system is measured by comparing the illumination intensity at the sensor to the expected intensity at the sensor if there was no distortion in the lens system. Therefore, small amounts of distortion of the lens system are measured.

16 Claims, 5 Drawing Sheets

LENS DISTORTION MEASUREMENT USING MOIRE FRINGES

FIELD OF THE INVENTION

This invention relates to optics and more particularly to projection lens distortion measurement.

BACKGROUND OF THE INVENTION

Knowledge of the precise distortion characteristics of a particular projection lens system ("lens") is required in a variety of optics applications such as in VLSI and ULSI photolithographic technology. A lens with unwanted distortion could cause defects in IC chips and thus lower the yield per wafer and directly affect the profit margin of a manufacturer. It is to be understood that such projection lens systems are optically complex, including a large number of lens elements, and so their optical properties may be difficult to determine from purely theoretical considerations. The amount of distortion which will cause unwanted defects decreases as process technology provides for smaller IC feature dimensions and greater integration. Generally, the larger the lens, the more opportunity for the inadvertent introduction of distortion. Therefore, distortion measurement is especially necessary where precision is required of larger lenses in LSI, VLSI, and ULSI processes.

Not all distortion is necessarily unwanted. Lens distortion measurement systems may be used to measure a lens in which the desired distortion is zero or a lens in which the desired distortion is nonzero (as in a telescope or microscope).

In a first prior art projection lens distortion measurement system for photolithographic lenses, an exposed mark is first formed on a semiconductor wafer in a predetermined position. The wafer is then loaded into a stepper. The illumination which defines the image of the mark passes through the lens to be measured. A sensor on the side of the lens remote from the illumination source detects the position of the mark in the transmitted image. The system then compares the actual position of the mark image received at the sensor to the expected position of the mark image if the desired distortion was present. The undesirable distortion can then be determined based on the offset of the mark. One commercially available software package which facilitates this process is called "AMS" software developed by Nikon Corporation.

This system requires fabricating a mark on a wafer thereby utilizing valuable equipment time and space. Furthermore, this system allows for measurement of only one position in the lens field at a time. Typically, distortion measurement of the entire field of the lens is desired. Therefore a lens distortion measurement system which can determine the distortion of the whole field of a lens without requiring process steps for forming a mark on a wafer was desired.

In a second prior art lens distortion measurement system, a mark is fabricated on a wafer. An additional machine for moving the wafer laterally with respect to the lens is used to move the wafer so that the mark image passes through a representative sampling of the entire field of the lens. This machine must be precise in its movements so that the actual location of the mark can be determined. One such commercially available machine is the Nikon "XY" system developed by Nikon Corporation. The process described above for the first prior art lens distortion measurement system is repeated for each point in the representative sample. Interpolation of the representative sample distortion measurements can be performed to obtain reasonable estimations of the distortion for points in the field that were not directly measured.

While this system allows for distortion measurement of the entire field of a lens, it still requires that a wafer be fabricated with a mark. Furthermore, this system requires the use of the additional machine which costs money and utilizes valuable chip fab real estate. Even though the machine is precise, it can introduce significant error if the actual movement of the wafer does not exactly match the expected movement, thereby presenting the system with a false position of the mark and thus false distortion measurement. This distortion is called "stage accuracy" distortion and is currently the most limiting factor in obtaining an accurate distortion measurement.

Therefore, what is desired is a lens distortion measurement system which determines the distortion of the entire field of a lens without requiring a mark on a wafer and without requiring an additional machine that introduces stage inaccuracies.

SUMMARY

In accordance with this invention, a structure and method are provided for measuring distortion in a lens system (such as a projection lens). The structure includes a first series of opaque parallel lines (i.e. a grating) having a fixed pitch located on a transparent support such as a quartz reticle. The reticle is disposed between an illumination source and the lens system whose distortion is being measured. An image sensor is provided at the other end of the lens system being measured. A second grating having a fixed pitch slightly different from the pitch of the first grating is provided on another transparent support such as a quartz reticle. This reticle is disposed between the lens system and the image sensor. Optionally, a relay lens is disposed between the second reticle and the image sensor.

Illumination propagates from the illumination source through the first reticle, through the lens system, through the second reticle and is incident on the image sensor. As the illumination passes through the first and second gratings, the illumination forms a Moire fringe having a pitch orders of magnitude greater than the pitches of the first and second gratings. Distortion of the lens system is measured by comparing the illumination intensity at a pixel (location) on the image sensor to the expected intensity at that pixel if there was no distortion. Therefore, small levels of distortion are measured.

The first grating is located between the illumination source and the lens system. The second grating is located between the lens system and the image sensor. The gratings are positioned such that the illumination pattern that passes through the first grating is incident on the second grating after it passes through the lens system and such that illumination that passes through the second grating is incident on the image sensor. The image sensor detects the illumination and a data representation of the illumination incident on the image sensor is produced. The data representation is processed and the distortion characteristics of the lens system are determined from the processed data representation.

DETAILED DESCRIPTION

Figure 1:
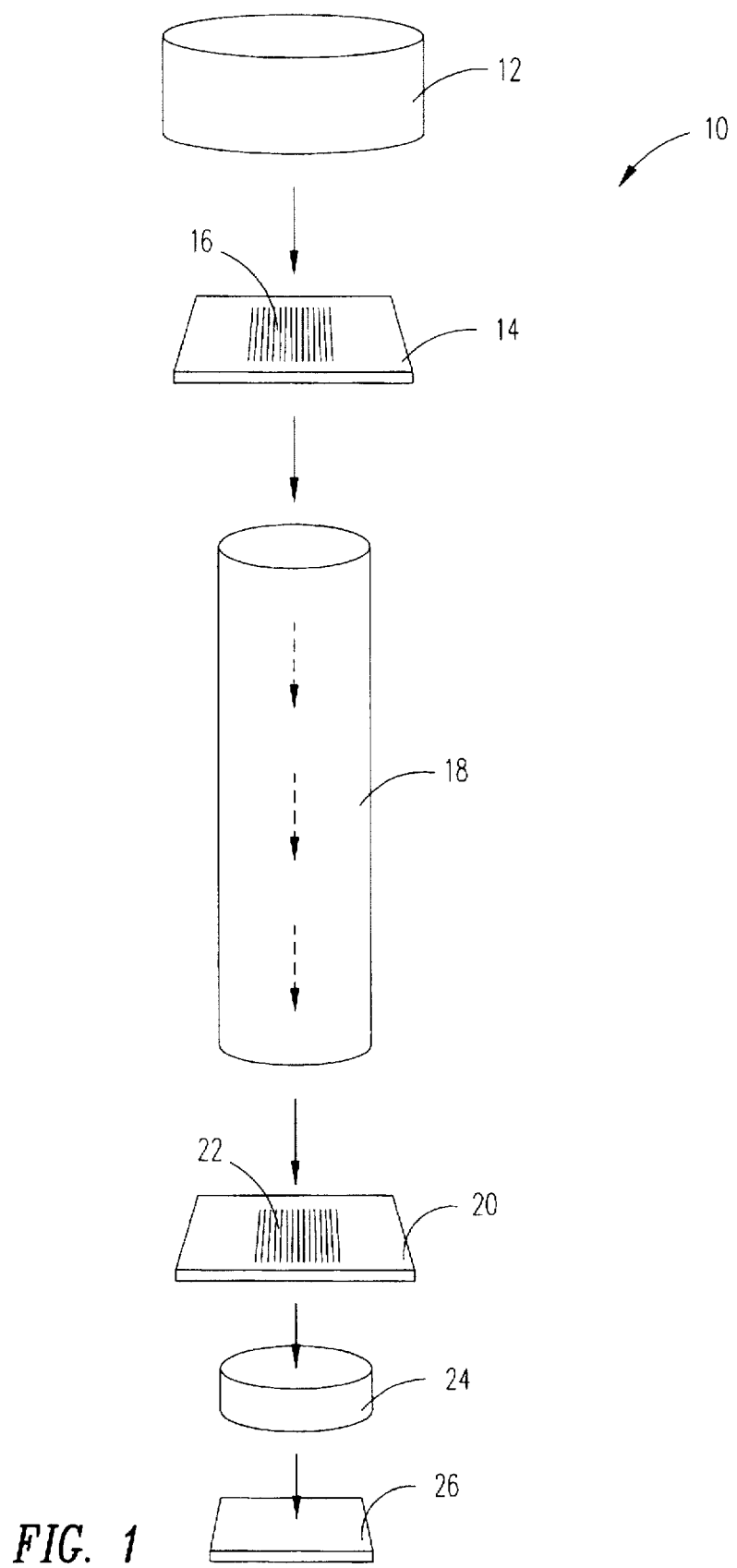
FIG. 1 is a plan diagram of a lens distortion measurement system according to the principles of the present invention.

Several embodiments of the distortion measurement system using Moire fringes according to the principles of the present invention are described hereafter. "Proximal" means closer to illumination source 12 (FIG. 1) and "remote" means further from illumination source 12 (FIG. 1). "Illumination" means any electromagnetic propagation regardless of wavelength unless specifically provided otherwise.

When a first series of evenly spaced opaque homogenous objects such as parallel lines of a fixed pitch is placed in the path of propagated illumination of a constant intensity, the illumination forms a pattern after the first series of objects that varies sinusoidally in intensity in a direction perpendicular to propagation. This type of pattern will, hereafter, be referred to as a "fringe". When a second series of evenly spaced opaque homogenous objects of a slightly different pitch is placed in the path of the propagated fringe, a second pattern forms by refraction after the second series of objects. This second pattern has a much larger period than the first fringe and will, hereafter, be referred to, as a "Moire fringe".

FIG. 1 is a plan diagram of the lens distortion measurement system according to the present invention. The distortion measurement system 10 includes an illumination source 12, a proximal (first) reticle 14 with a proximal grating 16 disposed evenly thereon or therein, a projection lens 18 whose distortion is being measured, a remote (second) reticle 20 with remote grating 22 disposed evenly thereon or therein, an optional relay lens 24, and an image sensor 26.

Proximal reticle 14 and remote reticle 20 are preferably made of quartz and their respective gratings are aligned parallel to one another as shown in FIG. 1. Other materials, such as glass, may also be used if the material does not introduce significant distortion relative to the distortion of the measured lens 18. Remote reticle 20 is positioned remotely relative to the projection lens 18 such that the projected image from the proximal reticle 14 is not magnified or reduced on the remote reticle 20.

The gratings are formed conventionally by depositing thin layers of material (e.g. chromium) which are then patterned by photolithographic processes on reticles (14 and 20). The gratings are preferably evenly spaced straight lines in order to maximize the contrast of the Moire fringe. However, one skilled in the art will recognize that curved and bent lines may also be used in the gratings in accordance with the principles of the present invention. The preferable pitch of these grating will vary depending on the application. For a stepper lithographic system, the preferable pitch is equal to the minimum resolution of the stepper. However, one skilled in the art will recognize that gratings of other pitches may effectively implement the principles of the invention.

Figure 2:
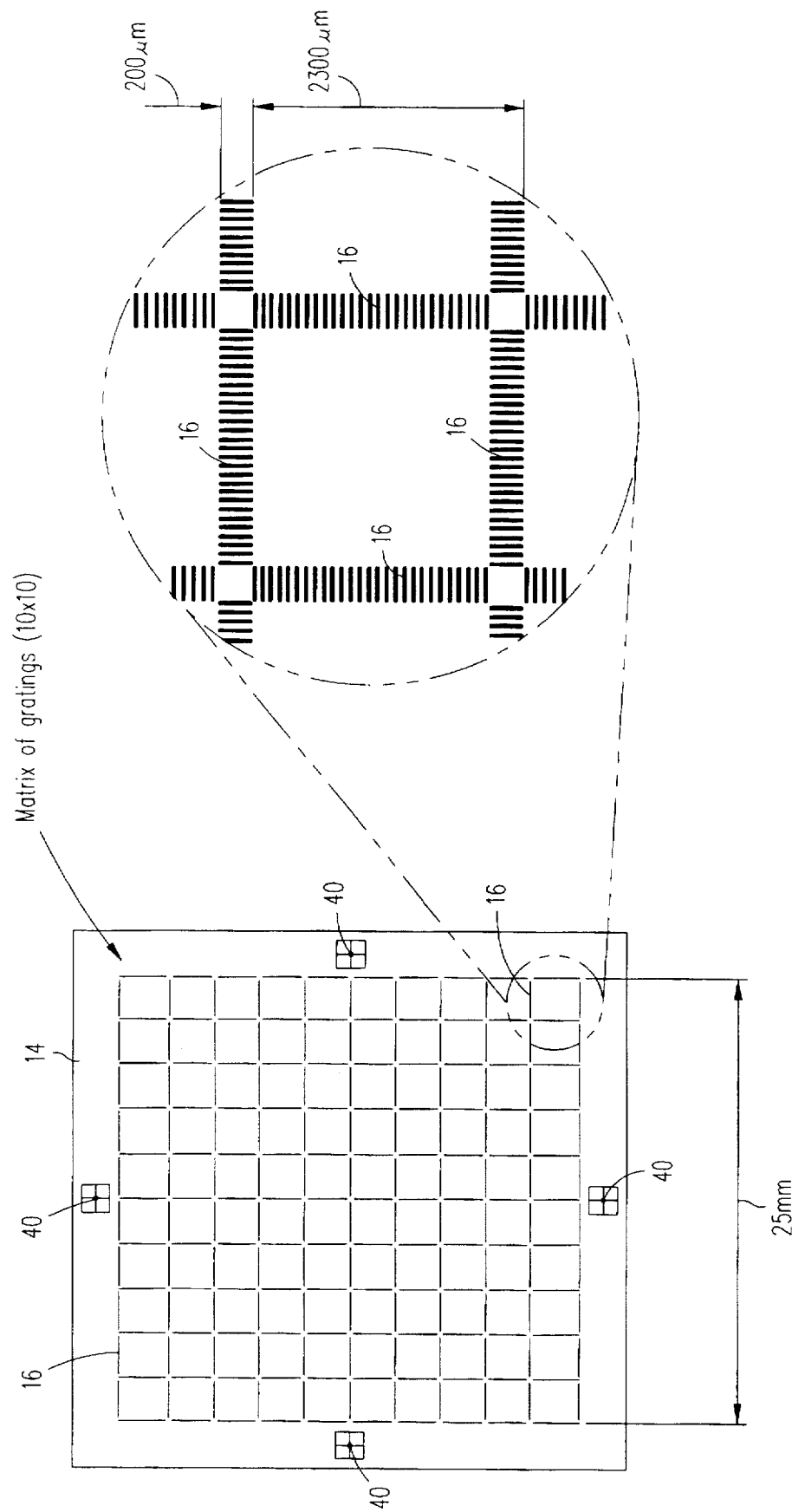
FIG. 2 shows a top view of the grating formed in a matrix pattern according to one embodiment of the invention.

In one embodiment of the invention, the grating 16 is two sets of orthogonal "stacks" of parallel lines arranged in a matrix pattern as shown in FIG. 2. Remote reticle 20 (not shown) is configured with a similar matrix pattern. The proximal reticle 14 and the remote reticle 20 are aligned using alignment marks 40 on the proximal reticle 14 and corresponding alignment marks (not shown) on the remote reticle 20 so that the corresponding matrix patterns of gratings (16 and 22) overlap in the direction of propagation.

Since the distortion is measured by the overlapping of the proximal and remote gratings (16 and 22) as described below, if the fringe of the matrix pattern is large enough to pass through a representative sampling of the entire field of the projection lens 18, then a distortion at each point on the entire projection lens 18 is either directly measured or a distortion value is reasonably interpolated based on the direct measurements. In other embodiments, the proximal and remote grating (16 and 22) is a single stack of parallel lines.

Figure 3A:
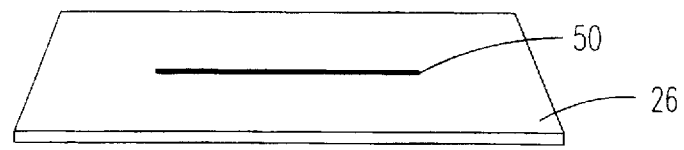
FIG. 3a shows a perspective view of a linear image sensor according to one embodiment of the invention.

FIG. 3a shows a perspective view of a linear image sensor 26 according to one embodiment of the invention. Image sensor 26 has a linear array of photosensitive sensor elements 50, each detecting the intensity of the illumination incident on that sensor element. Photosensitive elements that sense illumination intensity are well known. The sensor element 50 may be, for example, a CCD or a photocell. The linear image sensor typically cannot simultaneously sense image samples from the entire field of the projection lens to be measured because of the limited dimensions of the linear array 50. This configuration occupies less space than other image sensors (FIGS. 3b and 3c) described hereafter. However, the image sensor must be maneuvered relative to the projected image on the image sensor 26 to obtain a good distortion measurement of the entire cross section of the image.

Figure 3B:
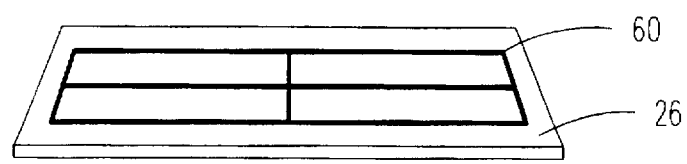
FIG. 3b shows a perspective view of a matrix pattern of a linear image sensor according to another embodiment of the invention.

FIG. 3b shows a perspective view of a matrix pattern of linear image sensors 26 according to another embodiment of the invention. Here, a simple 2×2 matrix is shown. However, to align with the matrix pattern shown in FIG. 2, a 10×10 matrix image sensor is needed. The sensor elements 60 are configured is a matrix pattern which aligns with the matrix pattern of gratings on proximal reticle 14 and remote reticle 20 such that the Moire image fall on the matrix of image sensor 26.

This image sensor is more complex than just one linear image sensor because it requires more linear image sensors. However, the time required to measure the distortion of the lens is reduced because the matrix image sensor needs to be aligned only once for the entire projection lens.

Figure 3C:
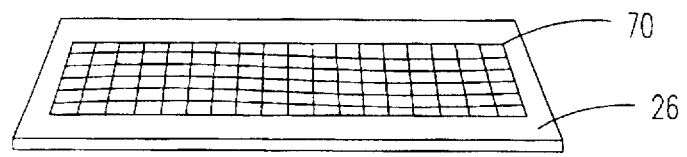
FIG. 3c shows a perspective view of a two dimensional image sensor according to another embodiment of the invention.

FIG. 3c shows a two dimensional image sensor 26 according to another embodiment of the invention. The two dimensional array of sensor elements 70 are placed within the projection of the Moire image from the remote reticle 20. Alignment is simpler because the precise positioning of multiple linear sensors is not necessary. It is sufficient that the image sensor be placed to capture the projected image.

Figure 4A:
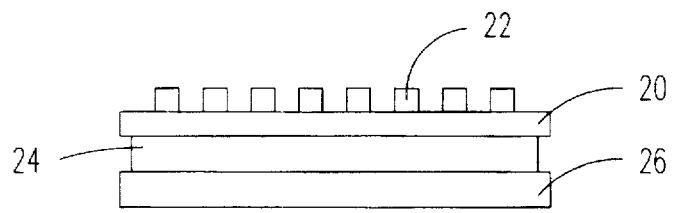
FIG. 4a shows a side view of the remote reticle, the image sensor, and a microlens array which acts as relay lens 24 according to one embodiment of the invention.

Relay lens 24 is provided to transmit illumination from remote reticle 20 to image sensor 26 without introducing significant distortion. FIG. 4a shows a side view of the remote reticle 20 with grating 22 disposed thereon, the image sensor 26, and a microlens array which acts as relay lens 24 according to one embodiment of the invention. The microlens array is a two dimensional array of smaller lenses aligned so as to be an optically similar to a single larger lens. Relay lens 24 includes an integral microlens array. Though smaller lenses typically have less distortion than larger lenses, the imperfect alignment of the lenses relative to other lenses in the array introduces some distortion. The remote grating 22 is formed on the proximal side of remote reticle 20 and the microlens array is disposed between and in contact with remote reticle 20 and image sensor 26. Image magnification by the Moire image allows use of the proximity configuration (or relay lens), since the distortion can be magnified by e.g. a factor of 10 to 1000 or greater. However the relay lens can reduce the error by giving a better image at the sensor.

Figure 4B:
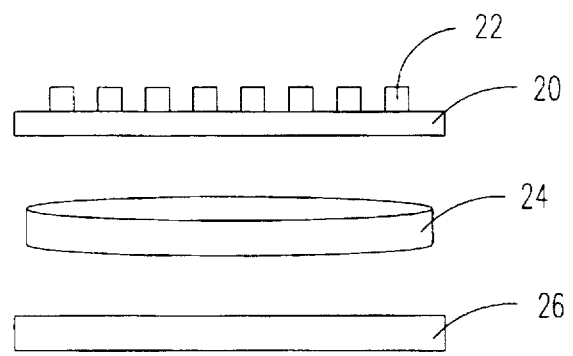
FIG. 4b shows a side view of the remote reticle, the image sensor, and a larger lens which acts as relay lens 24 according to another embodiment of the invention.

FIG. 4b shows a side view of the remote reticle 20 with grating 22 disposed thereon, the image sensor 26, and a larger lens which acts as relay lens 24 according to an alternative embodiment of the invention. Relay lens 24 here includes a single lens component and thus will typically introduce greater distortion than the microlens array of another embodiment. However, a single lens does not have to be aligned in an array thereby simplifying the construction of the relay lens 24 and eliminating the alignment distortions of the microlens array of another embodiment. Therefore, the single lens which is the relay lens 24 of FIG. 4b is less expensive and introduces slightly less distortion than the microlens array which is the relay lens 24 of FIG. 4a.

However, the larger lens requires a greater gap between the remote reticle 20 and image sensor 26. Therefore, a single larger lens may be a suitable and less expensive alternative than the microlens array in situations where reduction of the gap width between the remote reticle 20 and image sensor 26 due to space limitations is not critical. An example of such a situation is where the projection lens is separate from other equipment (i.e. a stepper) and thus relatively mobile.

Figure 4C:
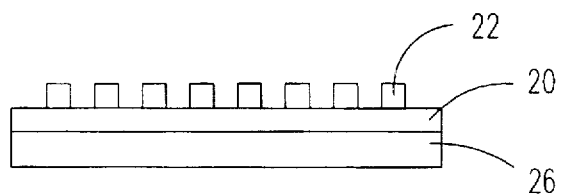
FIG. 4c shows a side view of the remote reticle and image sensor wherein there is no relay lens 24 but remote reticle 20 acts as a relay lens according to an alternative embodiment of the invention.

FIG. 4c shows a side view of the remote reticle 20 and image sensor 26 wherein there is no relay lens 24. Here, the remote side of the remote reticle 20 abuts image sensor 26 and the remote grating 22 is formed on the proximal side of the remote reticle 20. This embodiment requires less space than the other embodiment since it does not require a relay lens. Since quartz typically does not introduce significant distortion, this alternative embodiment reduces space and cost without significantly sacrificing accurate distortion measurements. The configuration of FIGS. 4a and 4c are more suited to measurement of a stepper projection lens which resides in a stepper since these configurations are more likely to fit in the stage system of a stepper.

Referring to the arrows of FIG. 1 indicating the optical path, illumination from illumination source 12 propagates in order through proximal reticle 14, projection lens 18, remote reticle 20, relay lens 24, and onto image sensor 26.

Illumination from illumination source 12 that passes through the spaces between the lines of proximal grating 16 define a first illumination pattern or fringe that falls on the remote grating 22. Illumination of the fringe that passes through the spaces between lines of remote grating 22 define a second illumination pattern or Moire fringe. This Moire fringe illumination pattern passes through relay lens 24 and onto image sensor 26.

As illumination passes through the spaces between the lines of the proximal grating 16, the illumination refracts. At a minimum distance from the proximal reticle remote from the illumination source 12, the first illumination pattern will be sinusoidal in intensity along a direction perpendicular to the direction of propagation. The minimum distance at which this occurs depends on the wavelength of the illumination and the pitch of proximal grating 16.

While this description is of one structure and method for forming a fringe, there are many structures and methods for providing such a pattern that are well known in the art.

The following equation defines a first transmittance pattern ($T_1$) at each point (x) along the remote reticle 20 where there is no distortion of the pattern between the proximal reticle 14 and the remote reticle 20 and assuming a constant illumination intensity at the proximal side of proximate reticle 14.

$$T_1 = \frac{1}{2} + \frac{1}{2} \cos 2\pi \frac{x}{p_1} \quad (1)$$

"$P_1$" represents the pitch of the proximal grating 16. "x" represents distance along the remote grating 22. The transmittance pattern is expressed as a percentage of the original illumination intensity. This equation represents the ideal situation where there is no distortion as in a vacuum.

However, where a lens, air, or other transparent medium is placed between the proximal reticle 14 and the remote reticle 20, there will typically be at least some distortion of the first illumination pattern. The distorted first transmittance pattern as it appears at the remote reticle 20 is defined by the following equation.

$$T_1 = \frac{1}{2} + \frac{1}{2} \cos 2\pi \frac{x + \Delta x}{p_1} \quad (2)$$

Here, "$\Delta x$" is the relative displacement of the image caused by the distortion of the first illumination pattern.

The following formula defines the second transmittance pattern as it appears at each point (x) along image sensor 26 assuming a constant illumination intensity at the proximal side of remote reticle 20.

$$T_2 = \frac{1}{2} + \frac{1}{2} \cos 2\pi \frac{x}{p_2} \quad (3)$$

"$P_2$" is the pitch of the remote grating 22. "x" represents distance along the image sensor 26. The transmittance pattern is expressed as a percentage of the original illumination intensity. Equation 3 assumes that the image sensor 26 is placed at a sufficient distance for the remote grating 22 such that the illumination that passes through the remote grating 22 may refract into a sinusoidal pattern or fringe in a direction perpendicular to propagation.

Of course, the illumination at the proximal side of remote reticle 20 will not be constant as assumed for Equation 3. The illumination at the proximal side of the remote reticle 20 will be the refracted light that varies sinusoidally with distance along the proximal side of remote reticle 20. The combined transmittance of proximal grating 16 and remote grating 22 and thus the second illumination pattern or Moire fringe (expressed as a percentage of the constant illumination intensity at the proximal side of proximal reticle 14) may be expressed as the product of $T_1$ and $T_2$. This product is as follows:

$$I_2 = T_1 T_2 = \frac{1}{4} + \frac{1}{4} \cos 2\pi \frac{x + \Delta x}{p_1} + \frac{1}{4} \cos 2\pi \frac{x}{p_2} + \quad (4)$$

-continued $$\frac{1}{8} \cos 2\pi \left[ \left( \frac{p_2 + p_1}{p_2 p_1} \right) x + \Delta \frac{x}{p_1} \right] +$$

$$\frac{1}{8} \cos 2\pi \left[ \left( \frac{p_2 - p_1}{p_2 p_1} \right) x + \Delta \frac{x}{p_1} \right]$$

However, image sensor 26 has a fixed number of sensor elements per unit area. For example, the sensor element density of the image sensor of one embodiment is approximately 115 sensor elements per period of the sinusoidal Moire fringe. However, accurate results can be obtained for sensor element densities much lower than this.

The ability of the image sensor to detect illumination patterns of higher frequencies is inhibited because the image sensor cannot sense illumination intensity between sensor elements. Therefore, the image sensor 26 acts as a low pass filter. The illumination that image sensor 26 will be able to detect will be the same as Equation 4 but with the high frequency elements removed as follows:

$$I_2 = T_1 T_2 = \frac{1}{4} + \frac{1}{8} \cos 2\pi \left[ \left( \frac{p_2 - p_1}{p_2 p_1} \right) x + \Delta \frac{x}{p_1} \right] \quad (5)$$

As apparent from Equation 5, the intensity detected by image sensor 26 varies sinusoidally from $\frac{1}{8}$ to $\frac{3}{8}$ of the intensity of the illumination at the proximal side of the proximal reticle 14. This sinusoidal wave is known as a Moire fringe because it was created by the overlap in the direction of propagation of proximal grating 16 and remote grating 22. The pitch ($P_M$) of the Moire fringe is taken from Equation 5 as follows:

$$P_M = \frac{p_2 p_1}{p_2 - p_1} \quad (6)$$

In one embodiment, the first pitch $P_1$ and the second pitch $P_2$ are nearly equal, but unequal. In another embodiment, the first pitch can be from 50% to 200% of the second pitch. In another embodiment, the first pitch can be from 99% to 101% of the second pitch.

For example, in one embodiment $P_1$ is 2.000 microns and $P_2$ is 2.004 microns. The pitch of the illumination recognized by the image sensor 26 ($P_M$) is 1 mm as shown by Equation 6. Therefore, the pitch has been magnified by a factor of approximately 500.

In one embodiment, the first pitch $P_1$ and the second pitch $P_2$ are equal. However, either the proximate reticle 14 or the remote reticle 20 is adjusted slightly so that the reticles (14 and 20) are close to being parallel, but not parallel. This has the same effect as though the reticles (14 and 20) were parallel and the pitches were close, but not equal. This embodiment has the advantage of allowing the use of the same masks for the fabrication of both proximal grating 16 and remote grating 22 and allows for the easy adjustment of the effective pitch of a reticle.

Figure 5:
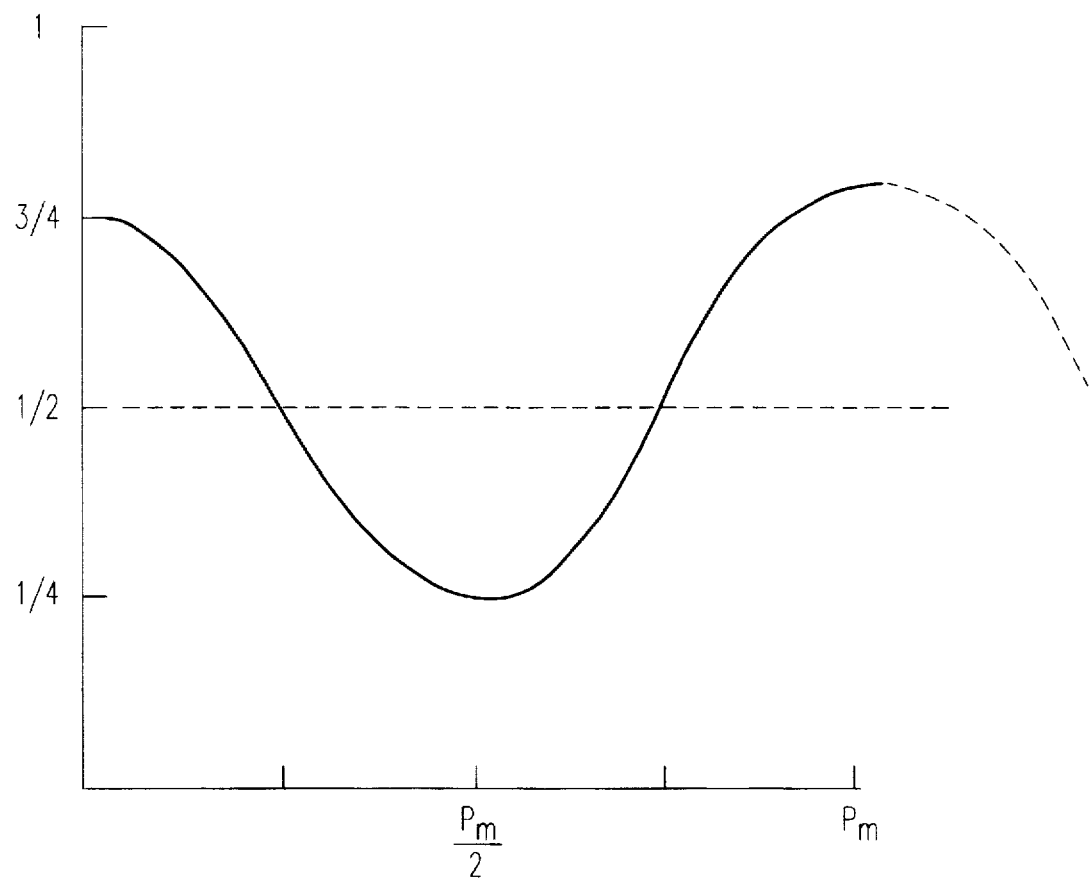
FIG. 5 is a graph of the Moire fringe detected by the image sensor 26.

FIG. 5 illustrates a graph of the Moire fringe detected by the image sensor 26. The vertical axis represents the percentage of intensity of illumination compared to the illumination intensity at the proximal side of the proximal reticle 14. The horizontal axis represents the distance along the Moire pattern is the direction perpendicular to propagation.

The ideal Moire fringe (given no distortion) is derived from Equation 5. $\Delta x$ is set at zero since distortion is assumed to be zero, and $P_M$ is substituted in to obtain the following equation:

$$I_M = \frac{1}{4} + \frac{1}{8} \cos 2\pi \frac{x}{P_M} \quad (7)$$

By integrating Equation 7 over the range of zero to $P_M/2$ and dividing the result by the magnitude of this range, the average inclination of contrast is determined to be $-1/P_M$. Movement of proximal reticle 14 or projection lens 18 distortion, however, will be magnified 500 times at image sensor 26 assuming $P_1$ is 2.000 microns and $P_2$ is 2.004 microns. Therefore, the average contrast change by actual relative motion between proximal reticle 14 and the image sensor 26 is $-500/P_M$ which equals $-1/p_1$. The contrast change due to a displacement or distortion of $\Delta x$ will result in a contrast of $(-1/p_1)\Delta x$.

Since $P_1$ is given as 2.000 microns, a relative displacement ($\Delta x$) of 1 nm (0.001 microns) will result in a change in intensity at the sensor element of the image sensor 26 of 1/2000. Therefore, if a 1/2000 change in contrast can be sensed by a sensor element, a transparent medium distortion of only 1 nm can be detected.

While some embodiments of the present distortion measurement system are shown herein, other embodiments are possible by varying the parameters within the above-described conditions in accordance with the present invention.

For example, it would be obvious to one skilled in the art that the above described invention may be used to measure distortion in any medium such as a pocket of air. The distortion could be used to determine density variations in the medium such as those caused by sound waves and the like. Furthermore, the described invention could be used to measure a whole optical system including both lenses and reflective elements by simply aligning the gratings (16 and 22).

The above invention has been described with regard to a remote reticle 20 positioned so that the images projected onto the remote reticle 20 from proximal reticle 14 are not magnified or reduced. However, one may position the remote reticle 20 at a position in which the projected image was enlarged or reduced by simply modifying the pitch of either of the proximal or remote gratings (16 and 22). For example, distortion of a lens that enlarges the projected image by a factor of two could be similarly accommodated by making the pitch of the proximal grating 16 to be 1.000 microns and the pitch of the remote grating to be 2.004 microns.

Usually one measures the position of the pattern projected on the wafer by the above-described method. If the physical size of the measurement apparatus is small enough to reside in the stage system of a photolithographic stepper system it can be used not only for inspection purposes, but also as a self calibration system to measure long term drift (distortion changes). Such a stepper system would have the capability to compensate for such a change after the distortion measurement is made.

This disclosure is illustrative and not limiting; further modifications will be apparent to one skilled in the art in the light of this disclosure and are intended to fall within the scope of the present claims.

I claim:

1. A system for measuring distortion of a lens comprising:
   a first grating having a first pitch;
   a second grating having a second pitch and spaced apart from said first grating wherein the lens is located between said first and second gratings; and
   an image sensor;
   wherein said first and second gratings are disposed relative to an illumination source and said image sensor such that illumination from said illumination source that passes through said first grating is incident on said second grating and such that illumination that passes through said second grating is incident on said image sensor.

2. The system of claim 1, wherein a first illumination pattern is defined by illumination from said illumination source that passes through said first grating and is incident on said second grating.

3. The system of claim 2, wherein said first illumination pattern has an intensity pattern in a direction perpendicular to a propagation direction, said intensity pattern varying approximately sinusoidally with distance along said propagation direction.

4. The system of claim 2, wherein a third pitch of said first illumination pattern that is incident on said second grating is between one half and twice said second pitch.

5. The system of claim 4, wherein said third pitch is between 99 percent and 101 percent of said second pitch.

6. The system of claim 1, wherein said image sensor is extended linearly.

7. The system of claim 1, wherein said second grating is on a transparent substrate.

8. The system of claim 7, further comprising at least one lens element located between said substrate and said image sensor.

9. The system of claim 8, further comprising additional lens elements located between each substrate and said image sensor.

10. The system of claim 1 further comprising a processor coupled to said image sensor for processing a signal from said image sensor, said signal being representative of an illumination pattern that falls on said image sensor, thereby determining a representative distortion of said lens, said illumination pattern being defined by illumination from said illumination source that passes through said first and second gratings.

11. The system of claim 1, wherein the illumination incident on said image sensor is a Moire fringe having a Moire pitch greater than said second pitch.

12. The system of claim 11, wherein said Moire pitch is at least ten times said second pitch.

13. The system of claim 1, wherein said first and second gratings each comprise a set of stacked parallel lines aligned orthogonally in a matrix pattern.

14. The system of claim 13, wherein said image sensor comprises a plurality of sensor elements arrayed in a matrix pattern.

15. A method of measuring distortion of a lens, comprising the steps of:

providing a first grating having a first pitch and which is located between an illumination source and a lens, a distortion of said lens being measured;

providing a second grating having a second pitch and which is located at an end of said lens remote from said illumination source, said first and second gratings being arranged to be parallel to one another;

positioning said second grating such that a first illumination pattern falls on said second grating when illumination is provided from said illumination source, said first illumination pattern being defined by illumination from said illumination source that passes through said first grating; and sensing a second illumination pattern when illumination is provided from said illumination source, said second illumination pattern being defined by illumination from said illumination source that passes through said second grating.

16. The lens distortion measurement method of claim 15, further comprising measuring a distortion of said lens from said step of sensing said second illumination pattern.

* * * * *